United States Patent
Park et al.

(10) Patent No.: US 10,985,218 B2
(45) Date of Patent: Apr. 20, 2021

(54) DISPLAY DEVICE AND METHOD OF FABRICATING THE SAME

(71) Applicant: SAMSUNG DISPLAY CO., LTD., Yongin-Si (KR)

(72) Inventors: Eung Seok Park, Seoul (KR); Yisu Kim, Seoul (KR); Jongwoo Kim, Hwaseong-Si (KR); Hyein Yang, Siheung-Si (KR); Wonmin Yun, Yongin-Si (KR); Byoungduk Lee, Seongnam-Si (KR); Yongchan Ju, Yongin-Si (KR); Jaeheung Ha, Suwon-Si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 16/584,142

(22) Filed: Sep. 26, 2019

(65) Prior Publication Data

US 2020/0227485 A1    Jul. 16, 2020

(30) Foreign Application Priority Data

Jan. 15, 2019    (KR) .......................... 10-2019-0004979

(51) Int. Cl.
*H01L 27/32*    (2006.01)
*H01L 51/52*    (2006.01)

(52) U.S. Cl.
CPC ........ *H01L 27/322* (2013.01); *H01L 51/5253* (2013.01); *H01L 51/5271* (2013.01); *H01L 51/5275* (2013.01); *H01L 27/3246* (2013.01)

(58) Field of Classification Search
CPC .............. H01L 27/322; H01L 51/5275; H01L 51/5253; H01L 51/5271; H01L 27/3246;
(Continued)

(56) References Cited

U.S. PATENT DOCUMENTS 6,911,772 B2    6/2005 Cok
10,114,247 B2    10/2018 Lee
(Continued)

FOREIGN PATENT DOCUMENTS

JP    2009-049003    3/2009
KR    10-2017-0014755    2/2017
(Continued)

OTHER PUBLICATIONS

European Search Report dated Jun. 25, 2020 Corresponding to European Patent Application No. 20151780.2.

*Primary Examiner* — Cuong B Nguyen
(74) *Attorney, Agent, or Firm* — F. Chau & Associates, LLC

(57) ABSTRACT

A display device includes a first substrate in which a first pixel region and a second pixel region are defined, a second substrate including a first display element and a second display element, a first layer having a first refractive index, and a second layer having a second refractive index. The first substrate includes a first wavelength conversion layer disposed in the first pixel region and a second wavelength conversion layer disposed in the second pixel region. A total reflection critical angle between the first layer and the second layer is smaller than an incident angle of light which is emitted from the first display element and is incident into the second wavelength conversion layer.

20 Claims, 12 Drawing Sheets

(58) Field of Classification Search
CPC ......... H01L 27/32–3234; H01L 31/125; H01L 51/50–56; H01L 2227/32–326; H01L 27/1214–1296; H01L 27/3244–3279; H01L 2021/775; H01L 27/3281–3288
See application file for complete search history.

(56) References Cited

U.S. PATENT DOCUMENTS

| | | |
|---|---|---|
| 2006/0043888 A1 | 3/2006 | Nakagawa et al. |
| 2014/0339521 A1* | 11/2014 | Ozawa ................ H01L 51/5253 257/40 |
| 2015/0287959 A1* | 10/2015 | Hanamura ........ H01L 21/02164 257/40 |
| 2016/0187755 A1 | 6/2016 | Kasegawa |
| 2017/0307932 A1 | 10/2017 | Lee et al. |
| 2018/0156951 A1 | 6/2018 | Baek et al. |
| 2018/0219183 A1 | 8/2018 | Song |

FOREIGN PATENT DOCUMENTS

| | | |
|---|---|---|
| KR | 10-2018-0064616 | 6/2018 |
| KR | 10-2018-0090421 | 8/2018 |

* cited by examiner

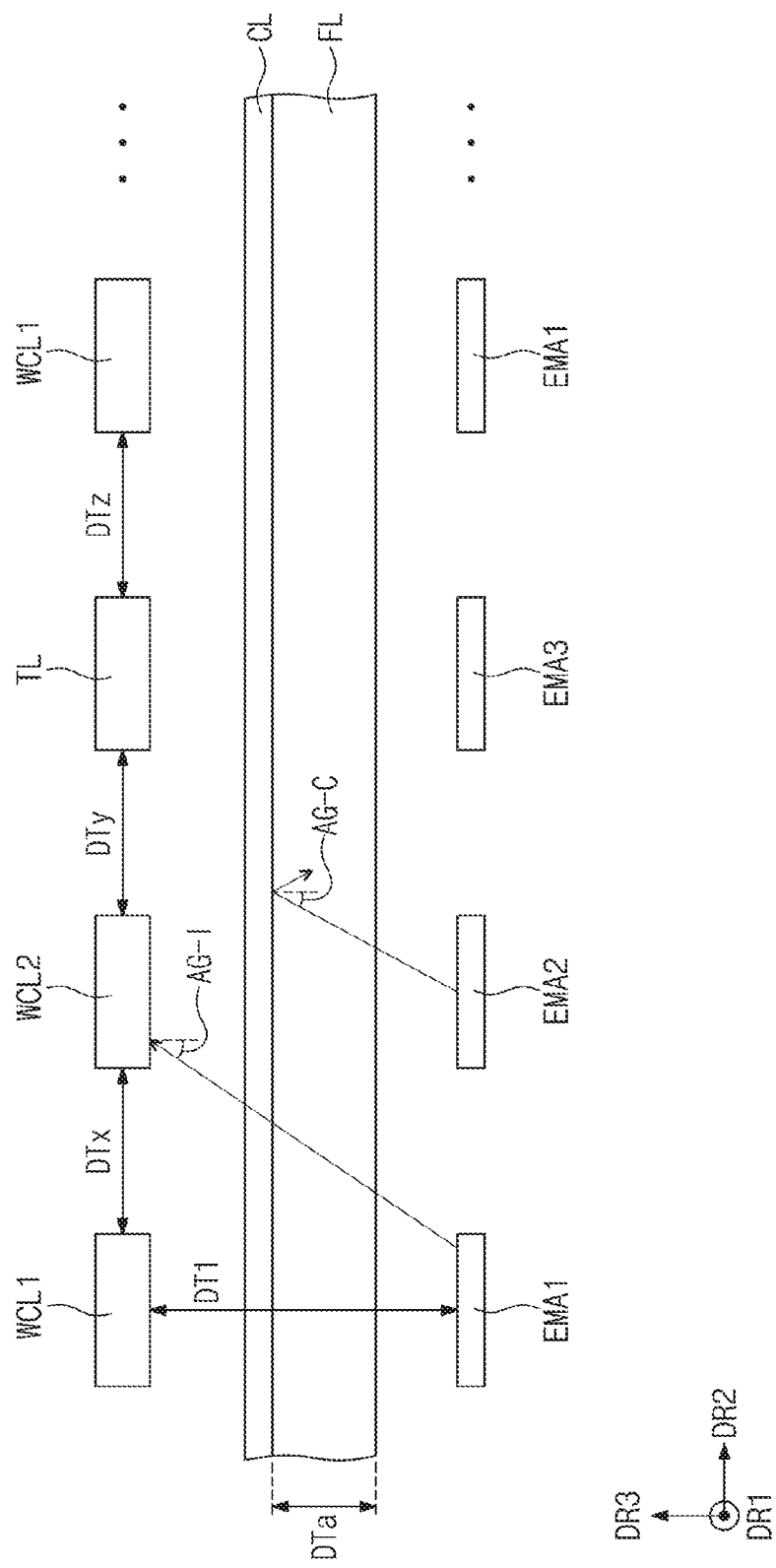

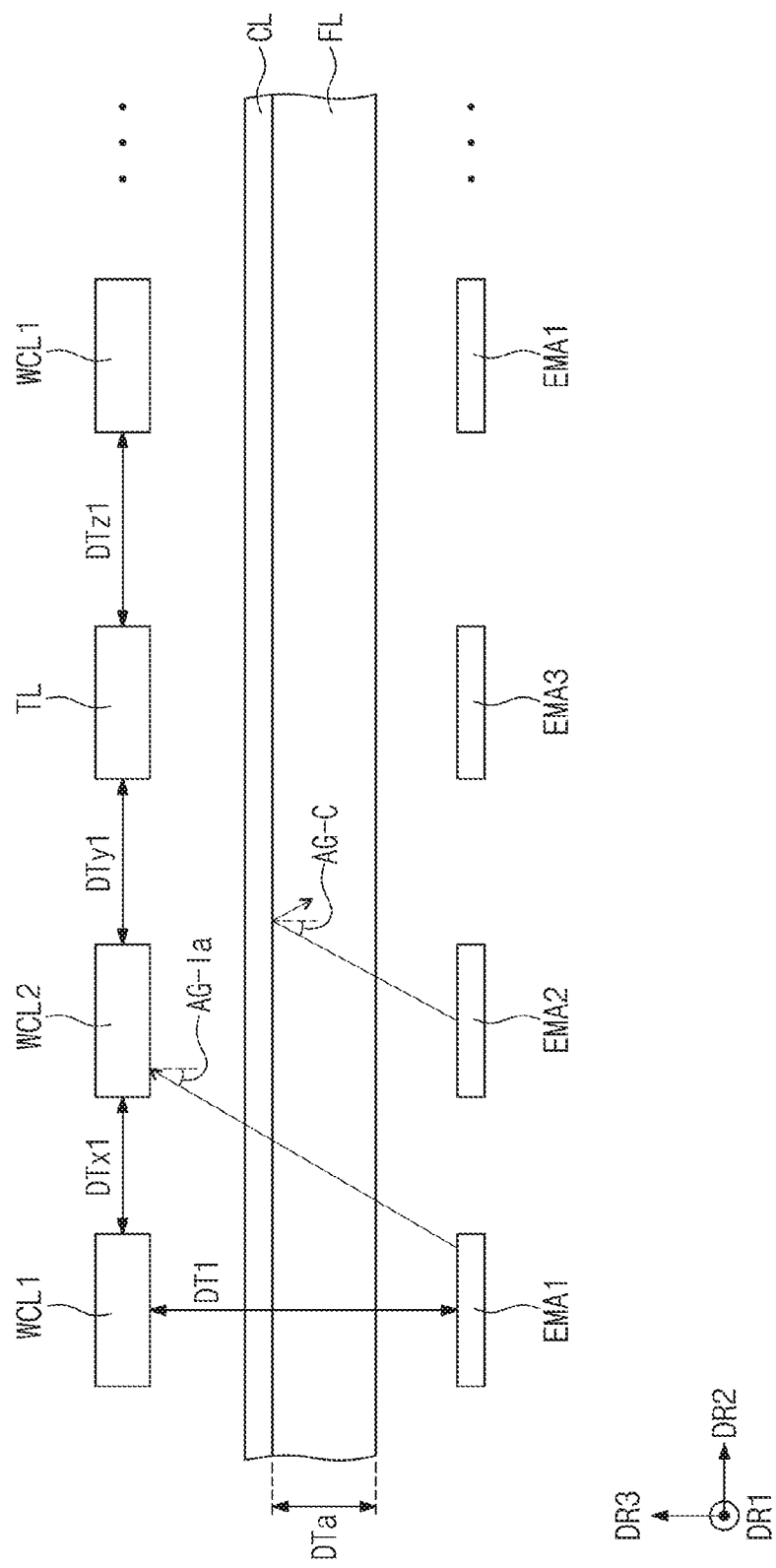

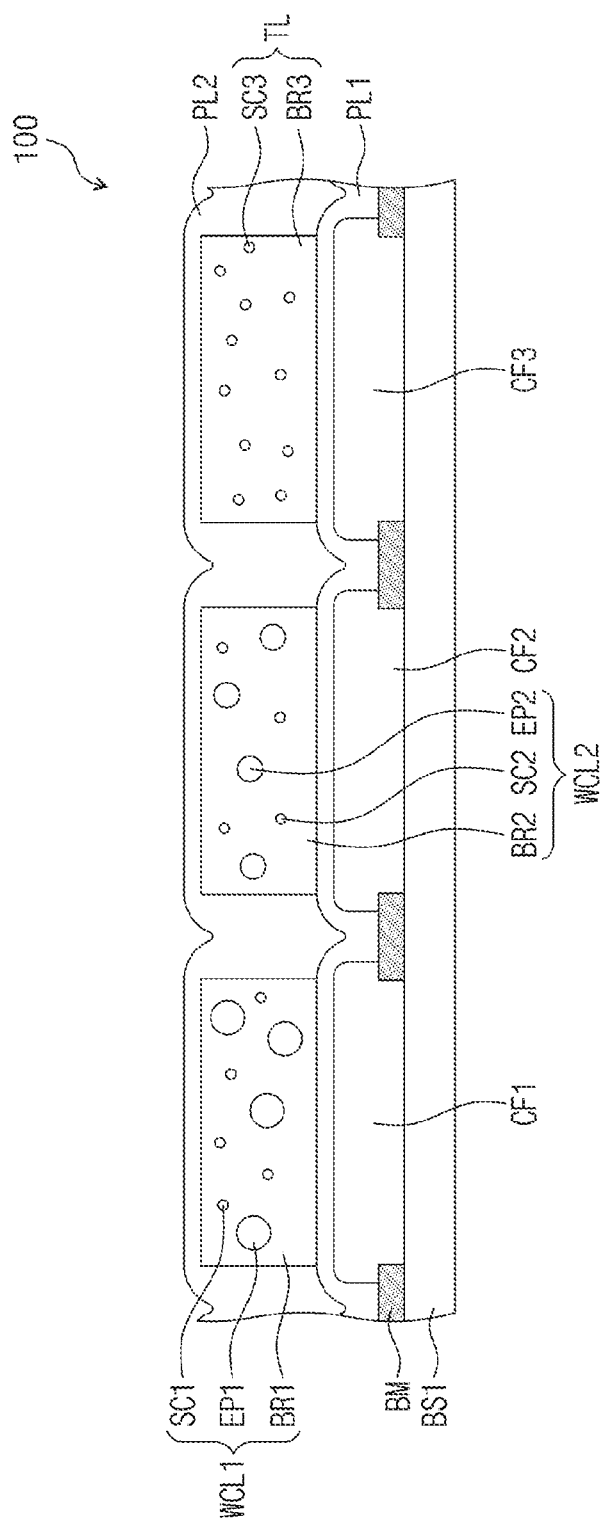

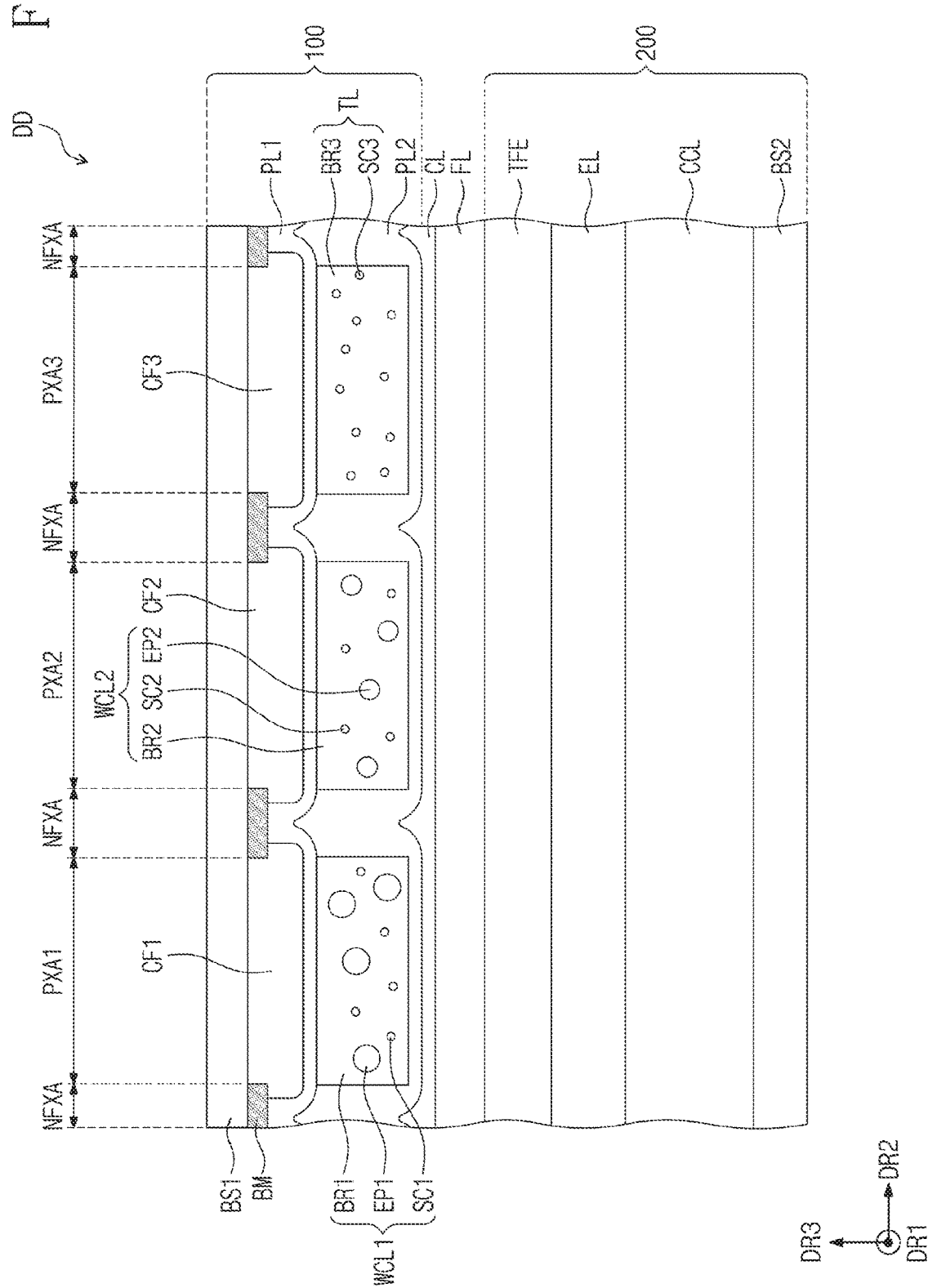

DISPLAY DEVICE AND METHOD OF FABRICATING THE SAME

CROSS-REFERENCE TO RELATED APPLICATIONS

This application claims priority under 35 U.S.C. § 119 to Korean Patent Application No. 10-2019-0004979, filed on Jan. 15, 2019 in the Korean Intellectual Property Office, the disclosure of which is hereby incorporated by reference in its entirety.

TECHNICAL FIELD

Exemplary embodiments of the present inventive concept relate to a display device having improved image quality, and a method of fabricating the same.

DISCUSSION OF THE RELATED ART

A display device includes a wavelength conversion member for representing a desired color. The wavelength conversion member includes a pigment particle of a specific color or a light emitter emitting light of a specific color. In a case in which light provided from a pixel region is provided to a wavelength conversion part adjacent thereto, a color-mixing issue may occur, in which light is emitted from not only a wavelength conversion part corresponding to the pixel region, but also from the adjacent wavelength conversion part.

SUMMARY

An exemplary embodiment of the inventive concept provides a display device having improved image quality, and a method of fabricating the display device.

According to an exemplary embodiment of the inventive concept, a display device includes a first substrate in which a first pixel region and a second pixel region are defined, a second substrate including a first display element and a second display element, a first layer, and a second layer. The first display element is disposed at a location corresponding to the first pixel region and the second display element is disposed at a location corresponding to the second pixel region. The first layer is disposed between the first substrate and the second substrate. The first layer has a first refractive index. The second layer is disposed between the first substrate and the first layer. The second layer has a second refractive index lower than the first refractive index. The first substrate includes a base layer, a first wavelength conversion layer disposed below the base layer and in the first pixel region, and a second wavelength conversion layer disposed below the base layer and in the second pixel region. A total reflection critical angle between the first layer and the second layer is smaller than an incident angle of light which is emitted from the first display element and is incident into the second wavelength conversion layer.

In an exemplary embodiment, the first substrate further includes a third pixel region defined therein, the second substrate further includes a third display element disposed at a location corresponding to the third pixel region, and the first substrate further includes an optically transparent layer disposed below the base layer and in the third pixel region.

In an exemplary embodiment, the total reflection critical angle is smaller than a minimum incident angle of light, which is emitted from one of the first display element, the second display element, and the third display element. Further, the light is incident into one of the first wavelength conversion layer, the second wavelength conversion layer, and the optically transparent layer, which does not correspond to the one of the first display element, the second display element, and the third display element.

In an exemplary embodiment, the first substrate further includes a protection layer covering the first wavelength conversion layer, the second wavelength conversion layer, and the optically transparent layer. The protection layer is disposed between the second layer and the first wavelength conversion layer, the second wavelength conversion layer, and the optically transparent layer.

In an exemplary embodiment, each of the first display element, the second display element, and the third display element includes a first electrode, a second electrode, and an emission layer disposed between the first electrode and the second electrode and provides a source light. The emission layers of the first display element, the second display element, and the third display element are connected to each other.

In an exemplary embodiment, the incident angle of light is $$\tan^{-1}\left(\frac{DT2}{DT1}\right),$$

in which DT1 is a distance between the emission layer and the second wavelength conversion layer, and DT2 is a distance between the first wavelength conversion layer and the second wavelength conversion layer.

In an exemplary embodiment, the optically transparent layer includes a base resin and scattering objects dispersed in the base resin. The first wavelength conversion layer includes a first light emitter that converts a wavelength of the source light, and the second wavelength conversion layer comprises a second light emitter that converts the wavelength of the source light and is different from the first light emitter.

In an exemplary embodiment, the source light is blue light.

In an exemplary embodiment, the emission layer includes at least two sub-emission layers.

In an exemplary embodiment, the first substrate further includes a first color filter layer disposed between the base layer and the first wavelength conversion layer, a second color filter layer disposed between the base layer and the second wavelength conversion layer, and a third color filter layer disposed between the base layer and the optically transparent layer.

In an exemplary embodiment, the first color filter layer is a red color filter layer, the second color filter layer is a green color filter layer, and the third color filter layer is a blue color filter layer.

According to an exemplary embodiment of the inventive concept, a display device includes a bottom plate including a plurality of light-emitting regions, and a top plate including a base layer and a plurality of optical layers disposed below the base layer, in which the plurality of optical layers corresponds to the light-emitting regions in a one-to-one manner. The display device further includes a first layer disposed between the bottom plate and the top plate, the first layer having a first refractive index, and a second layer disposed between the first layer and the top plate, the second layer having a second refractive index lower than the first refractive index.

The first refractive index and the second refractive index satisfy $$\sin^{-1}\left(\frac{n_2}{n_1}\right) < \tan^{-1}\left(\frac{DT2}{DT1}\right),$$

in which $n_1$ is the first refractive index, $n_2$ is the second refractive index, DT1 is a distance between one of the light-emitting regions and one of the plurality of the optical layers disposed on the one of the light-emitting regions, and DT2 is a distance between two adjacent layers of the plurality of optical layers.

In an exemplary embodiment, the light-emitting regions provide a blue light, and the plurality of optical layers includes a first wavelength conversion layer that converts the blue light to a red light, a second wavelength conversion layer that converts the blue light to a green light, and an optically transparent layer that transmits the blue light.

In an exemplary embodiment, DT2 is a minimum distance of a first distance between the first wavelength conversion layer and the second wavelength conversion layer, a second distance between the second wavelength conversion layer and the optically transparent layer, and a third distance between the first wavelength conversion layer and the optically transparent layer.

In an exemplary embodiment, the top plate further includes a red color filter layer disposed between the base layer and the first wavelength conversion layer, a green color filter layer disposed between the base layer and the second wavelength conversion layer, and a blue color filter layer disposed between the base layer and the optically transparent layer.

In an exemplary embodiment, the top plate further includes a protection layer covering the plurality of optical layers. The protection layer is disposed between the second layer and the plurality of optical layers.

According to an exemplary embodiment of the inventive concept, a method of fabricating a display device includes forming a first substrate including a first wavelength conversion layer and a second wavelength conversion layer, and forming a second substrate including a first display element and a second display element, in which the first display element is formed at a location corresponding to the first wavelength conversion layer and the second display element is formed at a location corresponding to the second wavelength conversion layer. The method further includes forming a low refraction layer on the first substrate, and forming a high refraction layer between the low refraction layer and the second substrate. The high refraction layer has a first refractive index, the low refraction layer has a second refractive index lower than the first refractive index, and the second refractive index is determined based on a thickness of the high refraction layer and the first refractive index.

In an exemplary embodiment, the second refractive index is within a range given by $$0 < n_2 < n_1 \times \sin\left(\tan^{-1}\left(\frac{DT2}{DTa}\right)\right),$$

in which $n_1$ is the first refractive index, $n_2$ is the second refractive index, DTa is the thickness of the high refraction layer, and DT2 is a distance between the first wavelength conversion layer and the second wavelength conversion layer.

In an exemplary embodiment, a total reflection critical angle between the high refraction layer and the low refraction layer is less than an incident angle of light that is emitted from the first display element and is incident into the second wavelength conversion layer.

In an exemplary embodiment, forming the first substrate includes forming a base layer, forming a plurality of color filter layers on a surface of the base layer, forming the first wavelength conversion layer, the second wavelength conversion layer, and an optically transparent layer on the plurality of color filter layers, and forming a protection layer on the first wavelength conversion layer, the second wavelength conversion layer, and the optically transparent layer. The low refraction layer is formed on the protection layer.

BRIEF DESCRIPTION OF THE DRAWINGS

The above and other features of the inventive concept will become more apparent by describing in detail exemplary embodiments thereof with reference to the accompanying drawings, in which:

FIG. 5 is a cross-sectional view schematically illustrating a portion of a display device according to an exemplary embodiment of the inventive concept.

FIG. 8 is a cross-sectional view schematically illustrating a portion of a display device according to an exemplary embodiment of the inventive concept.

FIGS. 9A to 9D are cross-sectional views schematically illustrating a method of fabricating a display device, according to an exemplary embodiment of the inventive concept.

DETAILED DESCRIPTION

Figure 1:
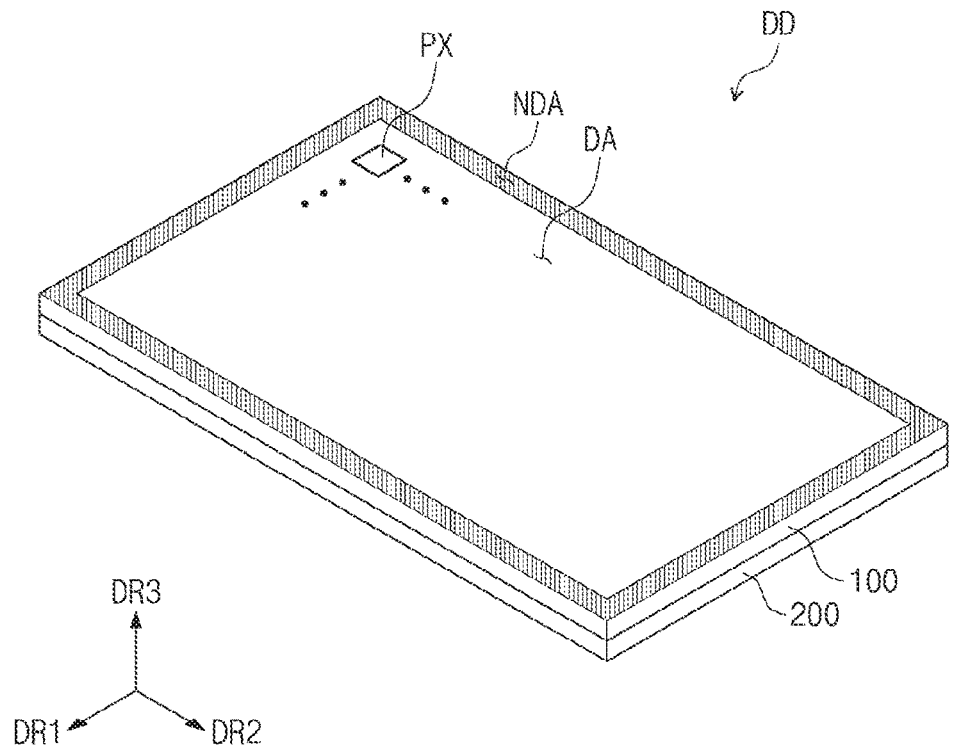
FIG. 1 is a perspective view illustrating a display device according to an exemplary embodiment of the inventive concept.

Exemplary embodiments of the inventive concept will be described more fully hereinafter with reference to the accompanying drawings. Like reference numerals may refer to like elements throughout the accompanying drawings.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the singular forms "a," "an" and "the" are intended to include the plural forms as well, unless the context clearly indicates otherwise.

Exemplary embodiments of the inventive concept are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments of the inventive concept should not be construed as limited to the particular shapes of regions illustrated herein, but are to include deviations in shapes that result, for example, from manufacturing.

The term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

When two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art. For example, when two or more elements or values are substantially the same as or about equal to each other but are not identical to each other, it is to be understood that the two or more elements or values are approximately the same as or equal to each other within a measurement error as would be understood by a person having ordinary skill in the art.

FIG. 1 is a perspective view illustrating a display device according to an exemplary embodiment of the inventive concept.

Referring to FIG. 1, a display device DD may be used for large-sized electronic devices (e.g., television sets, monitors, and outdoor billboards) or small- or medium-sized electronic devices (e.g., personal computers, notebook computers, personal digital assistants, car navigation systems, game machines, portable electronic devices, and cameras). However, it should be understood that these are merely examples of the inventive concept, and that other electronic devices may be used to realize the inventive concept.

A display region DA and a non-display region NDA may be defined in the display device DD. The display region DA may be a region in which an image is displayed. The non-display region NDA may a region in which an image not displayed. In exemplary embodiments, pixels PX may be disposed in the display region DA and are not disposed in the non-display region NDA. The pixels PX may mean effective pixels providing an image to a user.

The display region DA may be parallel to a plane defined by a first direction DR1 and a second direction DR2. A direction normal to the display region DA (e.g., a thickness direction of the display device DD) will be referred to as a third direction DR3. A front or top surface and a rear or bottom surface of each member may be distinguished based on the third direction DR3.

A bezel region of the display device DD may be defined by the non-display region NDA. For example, the bezel region of the display device DD may correspond to the non-display region NDA. The non-display region NDA may be a region adjacent to the display region DA. The non-display region NDA may enclose the display region DA. However, the inventive concept is not limited thereto. For example, the shapes of the display and non-display regions DA and NDA may be variously changed in a mutually influential manner. In exemplary embodiments, the non-display region NDA may be omitted.

The display device DD may include a first substrate 100 and a second substrate 200. The first substrate 100 may include pixel regions and a light-blocking region, and the second substrate 200 may include display elements. This will be described in more detail below. The first substrate 100 may be referred to as a top plate, and the second substrate 200 may be referred to as a bottom plate.

Figure 2:
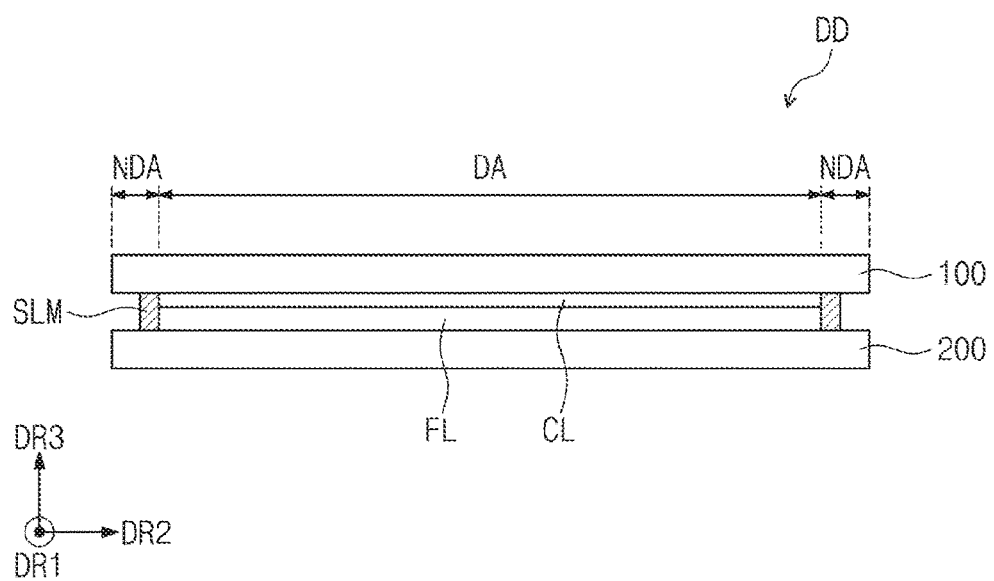
FIG. 2 is a cross-sectional view illustrating a display device according to an exemplary embodiment of the inventive concept.
Figure 3:
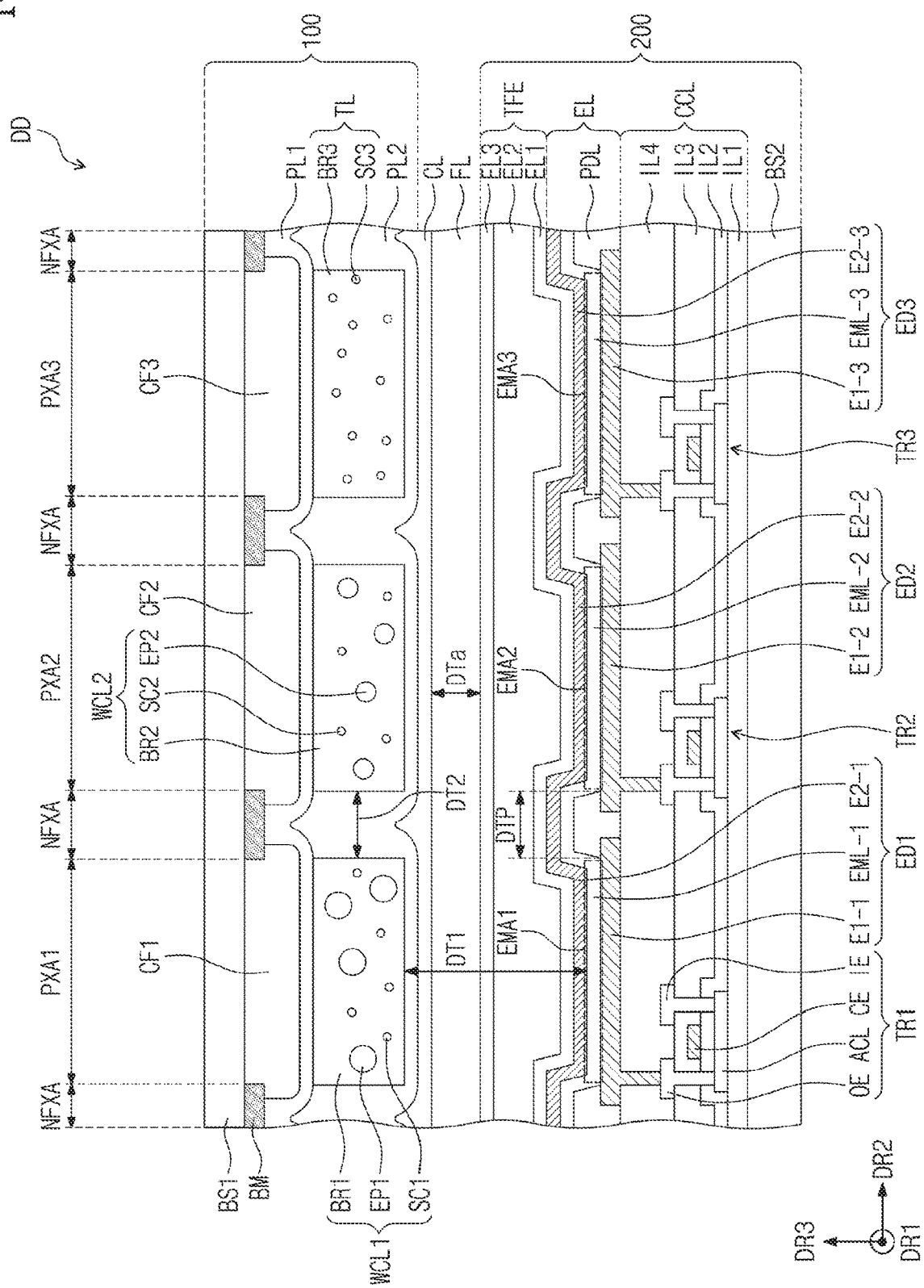
FIG. 3 is an enlarged cross-sectional view illustrating a portion of a display device according to an exemplary embodiment of the inventive concept.

FIG. 2 is a cross-sectional view illustrating a display device according to an exemplary embodiment of the inventive concept. FIG. 3 is an enlarged cross-sectional view illustrating a portion of a display device according to an exemplary embodiment of the inventive concept.

Referring to FIGS. 2 and 3, the display device DD may include the first substrate 100, the second substrate 200, a second layer CL, a first layer FL, and a sealant SLM. FIG. 3 illustrates an example in which the display device DD is an organic light emitting display device. The first substrate 100 may be a wavelength conversion substrate, and the second substrate 200 may be a display substrate. For example, the first substrate 100 may include a material which can convert a wavelength of an incident light or block light of a specific wavelength range. The second substrate 200 may be configured to provide light or to control transmittance of light. The first substrate 100 and the second substrate 200 will be described in more detail below.

First pixel regions PXA1, second pixel regions PXA2, third pixel regions PXA3, and a light-blocking region NFXA may be defined in the first substrate 100.

The first pixel regions PXA1 may be configured to provide a first color light, the second pixel regions PXA2 may be configured to provide a second color light, and the third pixel regions PXA3 may be configured to provide a third color light. The first color light, the second color light, and the third color light may be different from each other in terms of their colors or wavelengths. For example, one of the first to third color light may be a red light, another may be a green light, and the other may be a blue light.

The light-blocking region NFXA may be disposed adjacent to the first pixel regions PXA1, the second pixel regions PXA2, and the third pixel regions PXA3. The light-blocking region NFXA may set a border of each of the first pixel regions PXA1, the second pixel regions PXA2, and the third pixel regions PXA3. The light-blocking region NFXA may prevent a color-mixing issue from occurring between the first pixel regions PXA1, the second pixel regions PXA2, and the third pixel regions PXA3. For example, in a case in which light is provided from one of the first pixel region PXA1, the second pixel region PXA2, and the third pixel region PXA3 to a wavelength conversion part adjacent thereto, a color-mixing issue may occur in which the light is emitted from not only the intended wavelength conversion part corresponding to the pixel region emitting the light, but also from the adjacent wavelength conversion part corresponding to a different pixel region. Exemplary embodiments dispose the light-blocking region NFXA in a configuration that may prevent this color-mixing issue from occurring, or that may decrease the effects of this color-mixing issue. In addition, the light-blocking region NFXA may block a source light such that the source light is not provided to a user.

The first substrate 100 may include a base layer BS1, first to third color filter layers CF1, CF2, and CF3, a light-blocking layer BM, a plurality of optical layers WCL1, WCL2, and TL, and first and second protection layers PL1 and PL2.

The base layer BS1 may be a stack including, for example, a silicon substrate, a plastic substrate, a glass substrate, an insulating film, or a plurality of insulating layers.

The light-blocking layer BM may be disposed on a surface of the base layer BS1. The light-blocking layer BM may be overlapped with the light-blocking region NFXA when viewed in a plan view. In exemplary embodiments, the light-blocking layer BM is not overlapped with the first pixel regions PXA1, the second pixel regions PXA2, and the third pixel regions PXA3. For example, a plurality of openings may be defined in the light-blocking layer BM, and the plurality of openings may be overlapped with the first pixel regions PXA1, the second pixel regions PXA2, and the third pixel regions PXA3 when viewed in a plan view.

The first color filter layer CF1 may be disposed on the surface of the base layer BS1. For example, the first color filter layer CF1 may be disposed below the base layer BS1. The first color filter layer CF1 may be overlapped with the first pixel regions PXA1 when viewed in a plan view.

The second color filter layer CF2 may be disposed on the surface of the base layer BS1. For example, the second color filter layer CF2 may be disposed below the base layer BS1. The second color filter layer CF2 may be overlapped with the second pixel regions PXA2 when viewed in a plan view.

The third color filter layer CF3 may be disposed on the surface of the base layer BS1. For example, the third color filter layer CF3 may be disposed below the base layer BS1. The third color filter layer CF3 may be overlapped with the third pixel regions PXA3 when viewed in a plan view.

The first color filter layer CF1 may be a red color filter layer, the second color filter layer CF2 may be a green color filter layer, and the third color filter layer CF3 may be a blue color filter layer.

The first protection layer PL1 may cover the first to third color filter layers CF1, CF2, and CF3 and the light-blocking layer BM. The first protection layer PL1 may include, for example, one of silicon oxide, silicon nitride, or silicon oxynitride. In exemplary embodiments, the first protection layer PL1 may be omitted.

A plurality of the optical layers WCL1, WCL2, and TL may be disposed below the first protection layer PL1. The plurality of the optical layers WCL1, WCL2, and TL may include a first wavelength conversion layer WCL1, a second wavelength conversion layer WCL2, and an optically transparent layer TL.

The first wavelength conversion layer WCL1 may be disposed in the first pixel region PXA1, the second wavelength conversion layer WCL2 may be disposed in the second pixel region PXA2, and the optically transparent layer TL may be disposed in the third pixel region PXA3. The first wavelength conversion layer WCL1 may be disposed below the first color filter layer CF1, the second wavelength conversion layer WCL2 may be disposed below the second color filter layer CF2, and the optically transparent layer TL may be disposed below the third color filter layer CF3. The first wavelength conversion layer WCL1 may be disposed below the base layer BS1 in the first pixel region PXA1, and the second wavelength conversion layer WCL2 may be disposed below the base layer BS1 in the second pixel region PX2. The optically transparent layer TL may be disposed below the base layer BS1 in the third pixel region PX3.

The first wavelength conversion layer WCL1 may include a first base resin BR1, first scattering particles SC1, and first light emitters EP1. The second wavelength conversion layer WCL2 may include a second base resin BR2, second scattering particles SC2, and second light emitters EP2. The optically transparent layer TL may include a third base resin BR3 and third scattering particles SC3.

The first to third base resins BR1, BR2, and BR3 may be a medium material in which light emitters are dispersed, and may be made of at least one of various resin composites, which are in general called "binder". However, the inventive concept is not limited thereto. For example, in exemplary embodiments, when the light emitters are dispersed in a medium material, such a medium material may be referred to as a base resin, regardless of its name, additional function, or constituents. The base resin may be, for example, a polymer resin. For example, the base resin may be acrylic resins, urethane resins, silicone resins, and/or epoxy resins. The base resin may be transparent.

The first to third scattering particles SC1, SC2, and SC3 may be or include $TiO_2$ or silica-based nanoparticles and so forth. The first to third scattering particles SC1, SC2, and SC3 may cause scattering of light. An amount of the third scattering particles SC3 included in the optically transparent layer TL may be about equal to or larger than an amount of the first scattering particles SC1 included in the first wavelength conversion layer WCL1 and an amount of the second scattering particles SC2 included in the second wavelength conversion layer WCL2. For example, when the amount of the third scattering particles SC3 is larger than the amount of the first and second scattering particles SC1 and SC2, even if the optically transmitting layer TL does not include a light emitter, the light scattering degrees of the first and second wavelength conversion layer WCL1 and WCL2 and the light scattering degrees of the optically transmitting layer TL may be similar. In exemplary embodiments, the first and second scattering particles SC1 and SC2 may be omitted.

Each of the first light emitter EP1 and the second light emitter EP2 may be or include a particle converting a wavelength of an incident light. For example, each of the first light emitter EP1 and the second light emitter EP2 may be a quantum dot, a quantum rod, or a phosphor.

Each of the quantum dots may have a nanometer-order crystalline material consisting of hundreds to thousands of atoms, and due to their small size, the quantum dots may exhibit the quantum confinement effect causing an increase in band gap. In the case in which an energy of light incident to the quantum dots is larger than a band gap of each of the quantum dots, each of the quantum dots may absorb the light to be in an excited state, and then, may emit light of a specific wavelength, while returning to its ground state. The wavelength of the emitted light may be determined by the band gap. That is, by adjusting sizes or compositions of the quantum dots, a quantum confinement effect and light-emitting characteristics of the light emitters may be controlled.

The core of the quantum dot may be selected, for example, from the group consisting of II-VI compounds, III-V compounds, IV-VI compounds, IV elements, IV compounds, and combinations thereof.

The II-VI compounds may be selected, for example, from the group consisting of binary compounds (e.g., including CdSe, CdTe, ZnS, ZnSe, ZnTe, ZnO, HgS, HgSe, HgTe, MgSe, and MgS), mixtures of the binary compounds, ternary compounds (e.g., including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS), mixtures of the ternary compounds, quaternary compounds (e.g., including HgZnTeS, CdZnSeS, CdZnSeTe, CdZnSTe, CdHgSeS, CdHgSeTe, CdHgSTe, HgZnSeS, HgZnSeTe, and HgZnSTe), and mixtures of the quaternary compounds.

The III-V compounds may be selected, for example, from the group consisting of binary compounds (e.g., including GaN, GaP, GaAs, GaSb, AN, AlP, AlAs, AlSb, InN, InP, InAs, and InSb), mixtures of the binary compounds, ternary compounds (e.g., including GaNP, GaNAs, GaNSb, GaPAs, GaPSb, AlNP, AlNAs, AlNSb, AlPAs, AlPSb, InGaP, InNP, InNAs, InNSb, InPAs, and InPSb), mixtures of the ternary compounds, quaternary compounds (e.g., including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and GaAlNP), and mixtures of the quaternary compounds.

The IV-VI compounds may be selected, for example, from the group consisting of binary compounds (e.g., including SnS, SnSe, SnTe, PbS, PbSe, and PbTe), mixtures of the binary compounds, ternary compounds (e.g., including SnSeS, SnSeTe, SnSTe, PbSeS, PbSeTe, PbSTe, SnPbS, SnPbSe, and SnPbTe), mixtures of the ternary compounds, quaternary compounds (e.g., including SnPbSSe, SnPbSeTe, and SnPbSTe), and mixtures of the quaternary compounds. The IV elements may be selected, for example, from the group consisting of Si, Ge, and mixtures thereof. The IV compounds may include binary compounds selected, for example, from the group consisting of SiC, SiGe, and mixtures thereof.

Here, the binary, ternary, or quaternary compound may have a uniform concentration throughout the particle or may have a spatially varying concentration distribution in each particle. In exemplary embodiments, each of the quantum dots may have a core/shell structure, in which one quantum dot is enclosed by another quantum dot. At an interface between the core and the shell, an element contained in the shell may have a concentration gradient decreasing in a central direction.

In an exemplary embodiment, the quantum dot may have a core-shell structure, which includes a core containing the above-described nanocrystal and a shell surrounding the core. The shell of the quantum dot may be used as a protection layer, which prevents chemical characteristics of the core from being changed and preserves the semiconductor property of the core, and/or may be used as a charging layer, which allows the quantum dot to have an electrophoresis property. The shell may be a single layer or a multiple layer. At an interface between the core and the shell, an element contained in the shell may have a concentration gradient decreasing in a central direction. For example, the shell of the quantum dot may be formed of or include oxide compounds of metallic or nonmetallic elements, semiconductor compounds, or any combination thereof.

For example, the oxide compounds of metallic or nonmetallic elements for the shell may include binary compounds (e.g., $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and $NiO$) and ternary compounds (e.g., $MgAl_2O_4$, $CoFe_2O_4$, $NiFe_2O_4$, and $CoMn_2O_4$). However, the inventive concept is not limited to these examples.

In addition, the semiconductor compounds for the shell may include, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb. However, the inventive concept is not limited to these examples.

Each of the quantum dots may have a light-emitting wavelength spectrum whose full width half maximum (FWHM) is less than about 45 nm (e.g., less than about 40 nm in an exemplary embodiment, or less than about 30 nm in an exemplary embodiment). In this case, improved color purity or color reproduction characteristics may be realized. Furthermore, the quantum dots may allow light to be emitted radially, and thus, a viewing angle property may be improved.

In an exemplary embodiment, the quantum dots may be a spherical, pyramid-shaped, multi-arm, or cubic nano particle. In an exemplary embodiment, the quantum dots may be a nano tube, a nano wire, a nano fiber, or a nano plate-shaped particle. However, the inventive concept is not limited to these examples.

A wavelength or color of light emitted from the quantum dot may be determined by a particle size of the quantum dot, and by providing quantum dots of various sizes, various colors (e.g., blue, red, and green) may be realized.

According to an exemplary embodiment of the inventive concept, in the case in which the first light emitters EP1 and the second light emitters EP2 are quantum dots, a particle size each of the first light emitters EP1 may be different from a particle size of each of the second light emitters EP2. For example, the particle size of each of the first light emitters EP1 may be larger than the particle size of each of the second light emitters EP2. In this case, the first light emitters EP1 may emit light whose wavelength is longer than that of light emitted from the second light emitters EP2.

The first wavelength conversion layer WCL1 may convert a blue light to a red light and may provide the red light to the first color filter layer CF1. The second wavelength conversion layer WCL2 may convert a blue light to a green light and may provide the green light to the second color filter layer CF2. The optically transparent layer TL may scatter a blue light and may provide the scattered blue light to the third color filter layer CF3.

The first color filter layer CF1 may transmit light whose wavelength is within a wavelength range corresponding to red, but may absorb light of other wavelengths. The second color filter layer CF2 may transmit light whose wavelength is within a wavelength range corresponding to green, but may absorb light of other wavelengths. The third color filter layer CF3 may transmit light whose wavelength is within a wavelength range corresponding to blue, but may absorb light of other wavelengths.

The second protection layer PL2 may cover the first wavelength conversion layer WCL1, the second wavelength conversion layer WCL2, and the optically transparent layer TL. The second protection layer PL2 may include, for example, one of silicon oxide, silicon nitride, or silicon oxynitride.

The second substrate 200 may include a base layer BS2, a circuit layer CCL, an emission layer EL, and a thin film encapsulation layer TFE. The circuit layer CCL may be disposed on the base layer BS2. The circuit layer CCL may include a plurality of insulating layers, a plurality of conductive layers, and a semiconductor layer. The emission layer EL may be disposed on the circuit layer CCL. The thin film encapsulation layer TFE may seal and encapsulate the emission layer EL. In an exemplary embodiment, the thin film encapsulation layer TFE may be omitted.

The base layer BS2 may be a stack including a silicon substrate, a plastic substrate, a glass substrate, an insulating film, or a plurality of insulating layers.

The circuit layer CCL may include first to third transistors TR1, TR2, and TR3 and a plurality of insulating layers IL1, IL2, IL3, and IL4. The plurality of insulating layers IL1, IL2, IL3, and IL4 may include a first insulating layer IL1, a second insulating layer IL2, a third insulating layer IL3, and a fourth insulating layer IL4.

The first insulating layer IL1 may be disposed on the base layer BS2, and the first to third transistors TR1, TR2, and TR3 may be disposed on the first insulating layer IL1. The first to third transistors TR1, TR2, and TR3 may have substantially the same structure. Thus, the first transistor TR1 will be representatively described below. It is to be understood that the structure of the second and third transistors TR2 and TR3 may be substantially the same as the structure of the first transistor TR1 described below. The first transistor TR1 may include a control electrode CE, an input electrode IE, an output electrode OE, and a semiconductor layer ACL.

The semiconductor layer ACL may be disposed on the first insulating layer IL1. The first insulating layer IL1 may be a buffer layer providing a modified surface to the semiconductor layer ACL. In this case, the semiconductor layer ACL may have a higher adhesion strength to the first insulating layer IL1 than to the base layer BS2. In an exemplary embodiment, the first insulating layer IL1 may be a barrier layer protecting a bottom surface of the semiconductor layer ACL. In this case, the first insulating layer IL1 may prevent a contamination material or moisture, which is provided from or through the base layer BS2, from entering the semiconductor layer ACL. In an exemplary embodiment, the first insulating layer IL1 may be used as a light-blocking layer preventing external light, which is incident through the base layer BS2, from entering the semiconductor layer ACL. In this case, the first insulating layer IL1 may further include a light-blocking material.

The semiconductor layer ACL may include polycrystalline or amorphous silicon. In addition, the semiconductor layer ACL may include at least one of metal oxide semiconductor materials. The semiconductor layer ACL may include a channel region, which is used as a conduction path of electrons or holes, and a first doped region and a second doped region, which are spaced apart from each other with the channel region interposed therebetween.

The second insulating layer IL2 may be disposed on the first insulating layer IL1 and may cover the semiconductor layer ACL. The second insulating layer IL2 may include an inorganic material. The inorganic material may include, for example, at least one of silicon nitride, silicon oxynitride, silicon oxide, titanium oxide, or aluminum oxide.

The control electrode CE may be disposed on the second insulating layer IL2. The third insulating layer IL3 may be disposed on the second insulating layer IL2 and may cover the control electrode CE. The third insulating layer IL3 may be composed of a single layer or multiple layers. When composed as a single layer, the single layer may include, for example, an inorganic layer. When composed of multiple layers, the multiple layers may include, for example, an organic layer and an inorganic layer.

The input electrode IE and the output electrode OE may be disposed on the third insulating layer IL3. The input electrode IE and the output electrode OE may be connected to the semiconductor layer ACL through penetration holes penetrating the second insulating layer IL2 and the third insulating layer IL3.

The fourth insulating layer IL4 may be disposed on the third insulating layer IL3 and may cover the input electrode IE and the output electrode OE. The fourth insulating layer IL4 may be composed of a single layer or multiple layers. When composed of a single layer, the single layer may include, for example, an organic layer. When composed of multiple layers, the multiple layers may include, for example, an organic layer and an inorganic layer. The fourth insulating layer IL4 may be a planarization layer with a flat top surface.

The emission layer EL may be disposed on the fourth insulating layer IL4. The emission layer EL may include a first display element ED1, a second display element ED2, a third display element ED3, and a pixel definition layer PDL.

The first display element ED1 may be disposed to correspond to the first pixel region PXA1. That is, the first display element ED1 may be disposed at a location corresponding to the first pixel region PXA1. For example, the first display element ED1 may be overlapped with the first pixel region PXA1 when viewed in a plan view. The second display element ED2 may be disposed to correspond to the second pixel region PXA2. That is, the second display element ED2 may be disposed at a location corresponding to the second pixel region PXA2. For example, the second display element ED2 may be overlapped with the second pixel region PXA2 when viewed in a plan view. The third display element ED3 may be disposed to correspond to the third pixel region PXA3. That is, the third display element ED3 may be disposed at a location corresponding to the third pixel region PXA3. For example, the third display element ED3 may be overlapped with the third pixel region PXA3 when viewed in a plan view. The expression "when viewed in a plan view" as used herein means that the described structure is viewed in the third direction DR3.

The first display element ED1 may include a first electrode E1-1, a first emission layer EML-1, and a second electrode E2-1. The second display element ED2 may include a first electrode E1-2, a second emission layer EML-2, and a second electrode E2-2. The third display element ED3 may include a first electrode E1-3, a third emission layer EML-3, and a second electrode E2-3.

The first electrodes E1-1, E1-2, and E1-3 may be disposed on the fourth insulating layer IL4. The first electrodes E1-1, E1-2, and E1-3 may be electrically connected to the first to third transistors TR1, TR2, and TR3 in a one-to-one manner through penetration holes. For example, the first electrode E1-1 may be electrically connected to the first transistor TR1, the first electrode E1-2 may be electrically connected to the second transistor TR2, and the first electrode E1-3 may be electrically connected to the third transistor TR3.

The pixel definition layer PDL may expose at least a portion of each of the first electrodes E1-1, E1-2, and E1-3.

The first to third emission layers EML-1, EML-2, and EML-3 may be connected to each other to constitute a single emission layer. For example, the first to third emission layers EML-1, EML-2, and EML-3 may be disposed on the pixel definition layer PDL and the first electrodes E1-1, E1-2, and E1-3. The first to third emission layers EML-1, EML-2, and EML-3 may generate blue light. The first to third emission layers EML-1, EML-2, and EML-3 may have a tandem structure or a single-layered structure.

A region of the emission layer, which is overlapped with the first pixel region PXA1 in a plan view, may be defined as a first light-emitting region EMA1. A region of the emission layer, which is overlapped with the second pixel region PXA2 in a plan view, may be defined as a second light-emitting region EMA2. A region of the emission layer, which is overlapped with the third pixel region PXA3 in a plan view, may be defined as a third light-emitting region EMA3.

The second electrodes E2-1, E2-2, and E2-3 may be connected to each other to constitute a single second electrode. The second electrodes E2-1, E2-2, and E2-3 may be disposed on the first to third emission layers EML-1, EML-2, and EML-3.

A hole control layer may be provided between the first electrode and the emission layer, and an electron control layer may be disposed between the emission layer and the second electrode. The hole control layer may include at least one of a hole injection region, a hole transport region, a buffer region, and an electron preventing region. The electron control layer may include at least one of an electron injection region, an electron transport region, and a hole blocking region.

The thin film encapsulation layer TFE may be disposed on the second electrodes E2-1, E2-2, and E2-3. The thin film encapsulation layer TFE may directly cover the second electrodes E2-1, E2-2, and E2-3. In exemplary embodiments, a capping layer may be further disposed between the thin film encapsulation layer TFE and the second electrodes E2-1, E2-2, and E2-3 such that it covers the second electrodes E2-1, E2-2, and E2-3. In this case, the thin film encapsulation layer TFE may directly cover the capping layer. In exemplary embodiments, the thin film encapsulation layer TFE may be omitted.

The thin film encapsulation layer TFE may include a first inorganic layer EL1, an organic layer EL2, and a second inorganic layer EL3, which are sequentially stacked. The organic layer EL2 may be disposed between the first inorganic layer EL1 and the second inorganic layer EL3. The first inorganic layer EL1 and the second inorganic layer EL3 may be formed by depositing an inorganic material, and the organic layer EL2 may be formed by depositing, printing, or coating an organic material.

The first inorganic layer EL1 and the second inorganic layer EL3 may protect the emission layer EL from moisture and oxygen, and the organic layer EL2 may protect the emission layer EL from a contamination material such as, for example, dust particles. The first inorganic layer EL1 and the second inorganic layer EL3 may include, for example, at least one of silicon nitride, silicon oxynitride, silicon oxide, titanium oxide, or aluminum oxide. The organic layer EL2 may include a polymer (e.g., an acrylic organic layer). However, the inventive concept is not limited to this example.

FIG. 3 illustrates an example of the thin film encapsulation layer TFE including two inorganic layers and one organic layer. It is to be understood that the inventive concept is not limited to the example illustrated in FIG. 3. For example, in an exemplary embodiment, the thin film encapsulation layer TFE may include three inorganic layers and two organic layers. In this case, the inorganic layers and the organic layers may be disposed to have an alternately-stacked structure.

The first layer FL may be disposed between the first substrate 100 and the second substrate 200. The second layer CL may be disposed between the first layer FL and the first substrate 100.

The first layer FL may have a first refractive index, and the second layer CL may have a second refractive index lower than the first refractive index. The first layer FL may be called a high refraction layer, and the second layer CL may be called a low refraction layer. At least a fraction of light propagating from the first layer FL toward the second layer CL may be totally reflected. Due to a thickness DTa of the first layer FL, a gap may be formed between the first substrate 100 and the second substrate 200. As a result of the gap, light may enter a neighboring pixel, and this may lead to a color-mixing issue between adjacent pixels. An incident angle causing the color-mixing issue may be given by the following formula:

$$\tan^{-1}\left(\frac{DT2}{DT1}\right) \quad \text{[Formula 1]}$$

The first distance DT1 may be a distance between one of the emission layers and an optical layer disposed thereon. For example, the one of the emission layers may be the first emission layer EML-1, and the optical layer may be the first wavelength conversion layer WCL1. A second distance DT2 may be a distance between two adjacent optical layers. For example, the second distance DT2 may be a distance between the first wavelength conversion layer WCL1 and the second wavelength conversion layer WCL2. In addition, the second distance DT2 may correspond to a width DTP of the pixel definition layer PDL. For example, the second distance DT2 may be about equal to the width DTP of the pixel definition layer PDL. However, the inventive concept is not limited thereto. For example, in an exemplary embodiment, the second distance DT2 may be larger than the width DTP or less than the width DTP.

According to an exemplary embodiment of the inventive concept, light incident at an angle causing the color-mixing issue may be totally reflected at an interface between the first layer FL and the second layer CL. Thus, the color-mixing issue may be prevented from occurring between adjacent pixels (or may be reduced), and the image quality of the display device DD may be improved.

The first layer FL may include a material having a first refractive index. For example, the first layer FL may include a resin (e.g., silicone-based polymer, epoxy-based resins, or acrylic-based resins). However, the materials of the first layer FL are not limited to the above examples.

The second layer CL may include a material having a second refractive index lower than the first refractive index. For example, the second layer CL may include an inorganic material (e.g., one of silicon oxide, silicon nitride, or silicon oxynitride). The material of the second layer CL may be determined in consideration of characteristics of the first layer FL. For example, in an exemplary embodiment, the material of the second layer CL may be determined based on the first refractive index and/or the thickness of the first layer FL. In an exemplary embodiment, the second layer CL may include an organic material or may include both of organic and inorganic materials.

A gap between the first substrate 100 and the second substrate 200 may be maintained by the sealant SLM. The sealant SLM may be overlapped with the non-display region NDA. The sealant SLM may include, for example, an organic adhesive member, an inorganic adhesive member, or a frit. In an exemplary embodiment, the sealant SLM may be omitted.

Figure 4A:
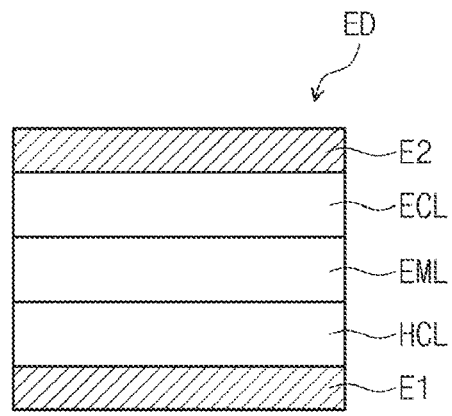
FIG. 4A is a cross-sectional view illustrating a display element according to an exemplary embodiment of the inventive concept.

FIG. 4A is a cross-sectional view illustrating a display element according to an exemplary embodiment of the inventive concept.

Referring to FIG. 4A, a display element ED may include a first electrode layer E1, a hole control layer HCL, an emission layer EML, an electron control layer ECL, and a second electrode layer E2. The hole control layer HCL may be disposed between the emission layer EML and the first electrode layer E1, and the electron control layer ECL may be disposed between the emission layer EML and the second electrode layer E2.

The hole control layer HCL may include at least one of a hole injection region, a hole transport region, a buffer region, and an electron preventing region. The hole control layer HCL may be a single layer made of a single material or a single layer made of several different materials, or may have a multi-layered structure including multiple layers made of several different materials. The hole control layer HCL may be composed of at least one of a hole injection material or a hole transport material. Each of the hole injection material and the hole transport material may be selected from the known materials.

The electron control layer ECL may include at least one of an electron injection region, an electron transport region, and a hole blocking region. The electron control layers ECL may be a single layer made of a single material or a single layer made of several different materials, or may have a multi-layered structure including multiple layers made of several different materials. The electron control layer ECL may include at least one of an electron transport material and an electron injection material. Each of the electron injection material and the electron transport material may be selected from the known materials.

The emission layer EML may include a host material and a dopant material. In an exemplary embodiment, a phosphorescent material, a fluorescent material, or thermally activated delayed fluorescent material may be used as the dopant material, which is provided in the host material of the emission layer EML. The emission layer EML may emit light of a specific color. For example, the emission layer EML may emit blue light.

Figure 4B:
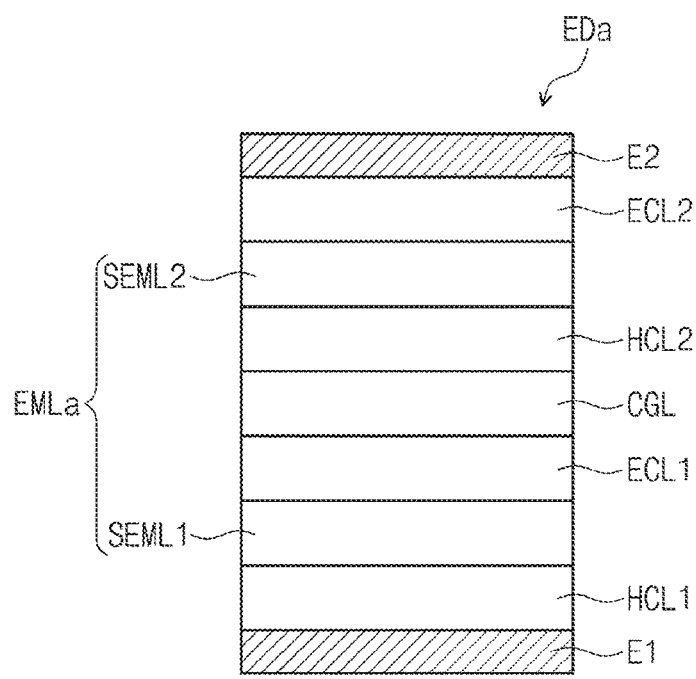
FIG. 4B is a cross-sectional view illustrating a display element according to an exemplary embodiment of the inventive concept.

FIG. 4B is a cross-sectional view illustrating a display element according to an exemplary embodiment of the inventive concept.

Referring to FIG. 4B, a display element EDa may include the first electrode layer E1, an emission layer EMLa, a first hole control layer HCL1, a first electron control layer ECL1, a charge generation layer CGL, a second hole control layer HCL2, a second electron control layer ECL2, and the second electrode layer E2. The emission layer EMLa may include a first sub-emission layer SEML1 and a second sub-emission layer SEML2.

The display element EDa may include the first electrode layer E1, the first hole control layer HCL1, the first sub-emission layer SEML1, the first electron control layer ECL1, the charge generation layer CGL, the second hole control layer HCL2, the second sub-emission layer SEML2, the second electron control layer ECL2, and the second electrode layer E2, which are sequentially stacked.

The charge generation layer CGL may inject electric charges into the first sub-emission layer SEML1 and the second sub-emission layer SEML2. The charge generation layer CGL may be disposed between the first sub-emission layer SEML1 and the second sub-emission layer SEML2 and may be used to control the balancing of charges.

In an exemplary embodiment of the inventive concept, the charge generation layer CGL may include an n-type charge generation layer and a p-type charge generation layer, and the p-type charge generation layer may be disposed on the n-type charge generation layer. The n-type charge generation layer and the p-type charge generation layer may be provided to have a junction structure. The n-type charge generation layer may be disposed adjacent to the first electrode layer E1, and the p-type charge generation layer may be disposed adjacent to the second electrode layer E2. The n-type charge generation layer may supply electrons to the first sub-emission layer SEML1 adjacent to the first electrode layer E1, and the p-type charge generation layer may supply holes to the second sub-emission layer SEML2. Since the charge generation layer CGL provides electric charges to each of the first sub-emission layer SEML1 and the second sub-emission layer SEML2, light-emitting efficiency may be increased and a driving voltage may be lowered.

In an exemplary embodiment, each of the first sub-emission layer SEML1 and the second sub-emission layer SEML2 may generate a light in a blue light wavelength band. For example, the light may have a wavelength of about 455 nm to about 492 nm. The first sub-emission layer SEML1 and the second sub-emission layer SEML2 may include the same material or may include materials different from each other.

The first sub-emission layer SEML1 may generate a first light. The second sub-emission layer SEML2 may generate a second light. Each of the first light and the second light may be a blue light. The first light and the second light may have the same spectrum or may have spectrums different form each other. For example, the first light may be one of deep blue light, light blue light, and blue light, and the second light may be one of deep blue light, light blue light, and blue light.

Figure 4C:
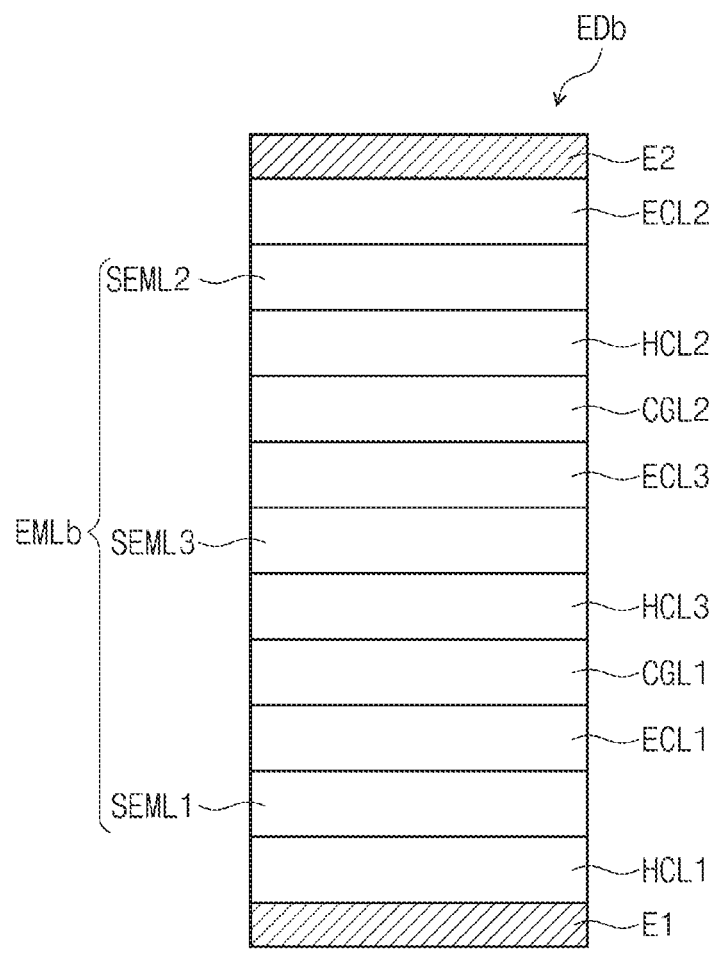
FIG. 4C is a cross-sectional view illustrating a display element according to an embodiment of the inventive concept.

FIG. 4C is a cross-sectional view illustrating a display element according to an exemplary embodiment of the inventive concept.

Referring to FIG. 4C, a display element EDb may include the first electrode layer E1, an emission layer EMLb, the first hole control layer HCL1, the first electron control layer ECL1, a first charge generation layer CGL1, the second hole control layer HCL2, the second electron control layer ECL2, a second charge generation layer CGL2, a third hole control layer HCL3, a third electron control layer ECL3, and the second electrode layer E2. The emission layer EMLb may include the first sub-emission layer SEML1, the second sub-emission layer SEML2, and a third sub-emission layer SEML3.

The third sub-emission layer SEML3 may be disposed between the first sub-emission layer SEML1 and the second sub-emission layer SEML2. The first sub-emission layer SEML1 and the second sub-emission layer SEML2 may correspond to the first and second sub-emission layers, respectively, of FIG. 4B.

The third sub-emission layer SEML3 may include a material different from the first sub-emission layer SEML1 and the second sub-emission layer SEML2. In an exemplary embodiment, the third sub-emission layer SEML3 may include the same material as at least one of the first sub-emission layer SEML1 and the second sub-emission layer SEML2.

A third light, which is generated by the third sub-emission layer SEML3, may be a blue light. For example, the third light may be one of a deep blue light, a light blue light, and a blue light.

The first charge generation layer CGL1 may be disposed between the first sub-emission layer SEML1 and the third sub-emission layer SEML3. Electrons generated in the first charge generation layer CGL1 may be provided to the first sub-emission layer SEML1 through the first electron control layer ECL1, and holes generated in the first charge generation layer CGL1 may be provided to the third sub-emission layer SEML3 through the third hole control layer HCL3.

The second charge generation layer CGL2 may be disposed between the second sub-emission layer SEML2 and the third sub-emission layer SEML3. Holes generated in the second charge generation layer CGL2 may be provided to the second sub-emission layer SEML2 through the second hole control layer HCL2, and electrons generated in the second charge generation layer CGL2 may be provided to the third sub-emission layer SEML3 through the third electron control layer ECL3.

FIG. 5 is a cross-sectional view schematically illustrating a portion of a display device according to an exemplary embodiment of the inventive concept.

Referring to FIG. 5, the first wavelength conversion layer WCL1, the second wavelength conversion layer WCL2, the optically transparent layer TL, the first light-emitting region EMA1, the second light-emitting region EMA2, the third light-emitting region EMA3, the first layer FL, and the second layer CL are illustrated.

Each of the first wavelength conversion layer WCL1, the second wavelength conversion layer WCL2, and the optically transparent layer TL may be provided in plural, and the first wavelength conversion layer WCL1, the second wavelength conversion layer WCL2, and the optically transparent layer TL may be alternately arranged in the second direction DR2.

A first distance DTx between the first wavelength conversion layer WCL1 and the second wavelength conversion layer WCL2, a second distance DTy between the second wavelength conversion layer WCL2 and the optically transparent layer TL, and a third distance DTz between the optically transparent layer TL and the first wavelength conversion layer WCL1 may be substantially the same. For example, the first wavelength conversion layer WCL1, the second wavelength conversion layer WCL2, and the optically transparent layer TL may be spaced apart from each other by about the same distance.

A first refractive index $n_1$ of the first layer FL may be higher than a second refractive index $n_2$ of the second layer CL. Thus, among light provided from the first, second, and third light-emitting regions EMA1, EMA2, and EMA3, light having an incident angle greater than a total reflection critical angle AG-C may be totally reflected at an interface between the first layer FL and the second layer CL.

The second refractive index $n_2$ may satisfy the condition given by Formula 2, shown below. According to an exemplary embodiment of the inventive concept, the second refractive index $n_2$ of the second layer CL may be determined in consideration of the thickness DTa of the first layer FL and the first refractive index $n_1$ of the first layer FL.

$$0 < n_2 < n_1 \times \sin\left(\tan^{-1}\left(\frac{DT2}{DTa}\right)\right) \quad \text{[Formula 2]}$$

Furthermore, the first refractive index $n_1$ and the second refractive index $n_2$ may satisfy the condition given by Formula 3:

$$\sin^{-1}\left(\frac{n_2}{n_1}\right) < \tan^{-1}\left(\frac{DT2}{DT1}\right) \quad \text{[Formula 3]}$$

The first distance DT1 may be a distance between the first light-emitting region EMA1 and the first wavelength conversion layer WCL1, and the second distance DT2 may be the minimum distance of the first distance DTx, the second distance DTy, and the third distance DTz. In an exemplary embodiment, since the first distance DTx, the second distance DTy, and the third distance DTz are equal to each other, the second distance DT2 may be one of the first distance DTx, the second distance DTy, and the third distance DTz.

In the case in which the second refractive index $n_2$ satisfies the conditions given by formulas 2 and 3, the total reflection critical angle AG-C may be smaller than an incident angle AG-I. The incident angle AG-I may be an incident angle of light, which is generated by the first light-emitting region EMA1 and is incident into the second wavelength conversion layer WCL2. The total reflection critical angle AG-C may be $$\sin^{-1}\left(\frac{n_2}{n_1}\right),$$

and the incident angle AG-I may be $$\tan^{-1}\left(\frac{DT2}{DT1}\right).$$

The incident angle AG-I may be an incident angle causing the color-mixing issue.

In an exemplary embodiment, the total reflection critical angle AG-C may be smaller than the incident angle AG-I. The incident angle AG-I may be the minimum incident angle of light. The light is emitted from one of the first, second, and third light-emitting regions EMA1, EMA2, and EMA3 and is incident into one of the first wavelength conversion layer WCL1, the second wavelength conversion layer WCL2, and the optically transparent layer TL, which does not correspond to the one of the light-emitting regions.

In the case in which light provided from a display element is incident into a neighboring wavelength conversion layer, a color-mixing issue may occur at the neighboring wavelength conversion layer. The neighboring wavelength conversion layer may be a wavelength conversion layer which does not correspond to the display element. According to an exemplary embodiment of the inventive concept, light, which is incident at an angle causing the color-mixing issue, may be totally reflected at an interface between the first layer FL and the second layer CL. Thus, according to exemplary embodiments, the color-mixing issue may be reduced or prevented, and an image quality of the display device may be improved.

Figure 6:
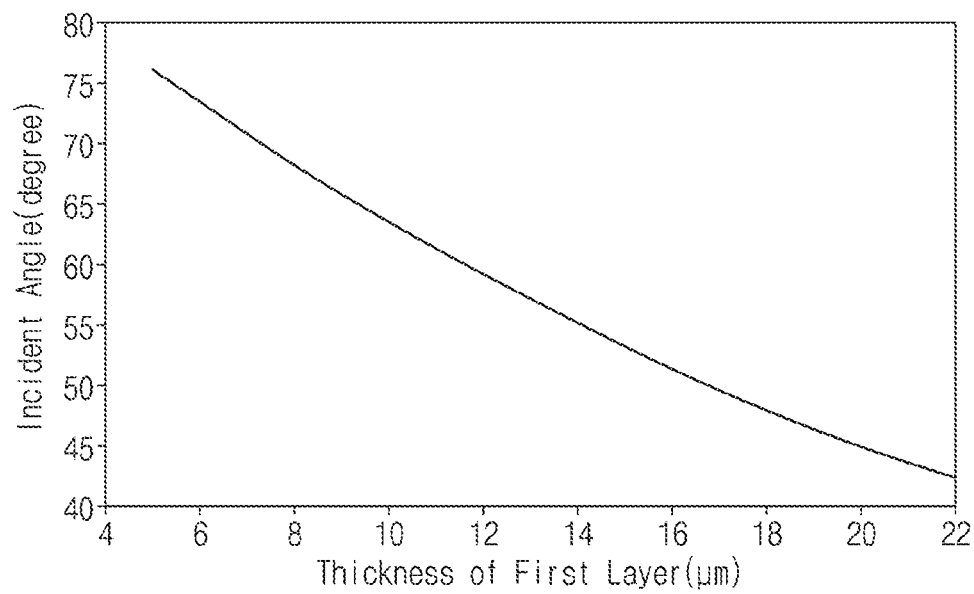
FIG. 6 is a graph showing a variation in incident angle with respect to a thickness of a first layer, according to an exemplary embodiment of the inventive concept.
Figure 7:
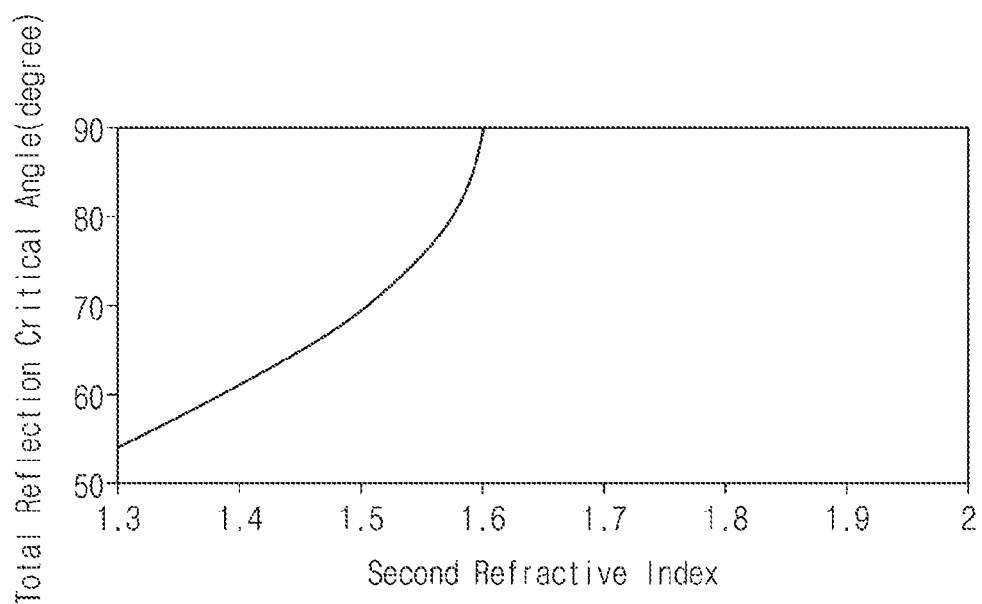
FIG. 7 is a graph showing a total reflection critical angle with respect to a second refractive index, according to an exemplary embodiment of the inventive concept.

FIG. 6 is a graph showing a variation in incident angle with respect to a thickness of a first layer, according to an exemplary embodiment of the inventive concept. FIG. 7 is a graph showing a total reflection critical angle with respect to a second refractive index, according to an exemplary embodiment of the inventive concept.

FIG. 6 shows a variation of the incident angle AG-I with respect to the thickness DTa of the first layer FL, which was obtained when the first distance DTx was 20 μm and the first refractive index of the first layer FL was 1.6. The incident angle AG-I may be an incident angle causing the color-mixing issue.

The larger the thickness DTa of the first layer FL, the smaller the incident angle AG-I. The thickness DTa of the first layer FL may be selected. For example, if the thickness DTa of the first layer FL is about 12 μm, the incident angle AG-I may be about 60°.

Referring to FIGS. 5 to 7, the second refractive index of the second layer CL may be selected such that the total reflection critical angle AG-C is less than the incident angle AG-I. In the previous case of the thickness DTa of about 12 μm, the incident angle AG-I causing the color-mixing issue may be about 60°. Thus, the second refractive index may be selected such that the total reflection critical angle AG-C is within a range less than 60°.

According to FIG. 7, the above requirement for the total reflection critical angle AG-C of 60° may be satisfied when the second refractive index is about 1.4. Thus, a material for the second layer CL may be selected to have a refractive index smaller than 1.4. It is to be understood that the values given with reference to FIGS. 6 and 7 are exemplary, and the inventive concept is not limited thereto.

A thickness of the second layer CL may be smaller than a thickness of the first layer FL. The thickness of the second layer CL may be several nanometers or larger. In exemplary embodiments, the thickness of the second layer CL may be several tens of nanometers or larger.

FIG. 8 is a cross-sectional view schematically illustrating a portion of a display device according to an exemplary embodiment of the inventive concept. For convenience of explanation, elements previously described with reference to FIG. 5 may be identified by the same reference numerals, and a further description of elements and technical aspects previously described may be omitted.

Referring to FIG. 8, the first wavelength conversion layer WCL1, the second wavelength conversion layer WCL2, the optically transparent layer TL, the first light-emitting region EMA1, the second light-emitting region EMA2, the third light-emitting region EMA3, the first layer FL, and the second layer CL are illustrated.

Each of the first wavelength conversion layer WCL1, the second wavelength conversion layer WCL2, and the optically transparent layer TL may be provided in plural, and the first wavelength conversion layers WCL1, the second wavelength conversion layers WCL2, and the optically transparent layers TL may be alternately arranged in the second direction DR2. One of a first distance DTx1 between the first wavelength conversion layer WCL1 and the second wavelength conversion layer WCL2, a second distance DTy1 between the second wavelength conversion layer WCL2 and the optically transparent layer TL, and a third distance DTz1 between the optically transparent layer TL and the first wavelength conversion layer WCL1 may be different from the others. For example, the first distance DTx1 and the second distance DTy1 may be about equal to each other, and the third distance DTz1 may be larger than the first distance DTx1 and the second distance DTy1.

In an exemplary embodiment, the total reflection critical angle AG-C may be less than the incident angle AG-Ia. The incident angle AG-Ia may be the minimum incident angle of light which is emitted from one of the first, second, and third light-emitting regions EMA1, EMA2, and EMA3 and is incident on one of the first wavelength conversion layer WCL1, the second wavelength conversion layer WCL2, and the optically transparent layer TL, which does not correspond to the one of the first, second, and third light-emitting regions EMA1, EMA2, and EMA3. For example, the total reflection critical angle AG-C and the incident angle AG-Ia may satisfy the condition given by Formula 4:

$$\sin^{-1}\left(\frac{n_2}{n_1}\right) < \tan^{-1}\left(\frac{DT2}{DT1}\right) \qquad \text{[Formula 4]}$$

The first distance DT1 may be a distance between the first light-emitting region EMA1 and the first wavelength conversion layer WCL1, and the second distance DT2 may be a minimum distance of the first distance DTx1, the second distance DTy1, and the third distance DTz1. In an exemplary embodiment, the second distance DT2 may be the first distance DTx or the second distance DTy. The total reflection critical angle AG-C may be $$\sin^{-1}\left(\frac{n_2}{n_1}\right),$$

and the incident angle AG-I may be $$\tan^{-1}\left(\frac{DT2}{DT1}\right).$$

The incident angle AG-I may be an incident angle causing the color-mixing issue.

FIGS. 9A to 9D are cross-sectional views schematically illustrating a method of fabricating a display device, according to an exemplary embodiment of the inventive concept.

Referring to FIG. 9A, the first substrate 100 may be formed. The formation of the first substrate 100 may include the following steps.

The base layer BS1 may be formed. During a process of fabricating a display device, the base layer BS1 may be disposed on a working substrate. The working substrate may be removed after the fabrication of the display device.

The light-blocking layer BM may be formed on a surface of the base layer BS1. A plurality of openings may be formed in the light-blocking layer BM.

The first to third color filters CF1, CF2, and CF3 may be formed on the surface of the base layer BS1. The first to third color filters CF1, CF2, and CF3 may correspond to the openings of the light-blocking layer BM in a one-to-one manner and may cover the openings.

The first protection layer PL1 may be formed on the first to third color filters CF1, CF2, and CF3. The first protection layer PL1 may include, for example, one of silicon oxide, silicon nitride, or silicon oxynitride.

The first wavelength conversion layer WCL1, the second wavelength conversion layer WCL2, and the optically transparent layer TL may be formed on the first protection layer PL1.

The second protection layer PL2 may be formed on the first wavelength conversion layer WCL1, the second wavelength conversion layer WCL2, and the optically transparent layer TL.

FIG. 9A illustrates an example in which one light-blocking layer BM is directly disposed on the base layer BS1. However, the inventive concept is not limited to this example. For example, a plurality of the light-blocking layers BM may be provided. In this case, one of the light-blocking layers BM may be directly disposed on the base layer BS1, and another of the light-blocking layers BM may be disposed between the first wavelength conversion layer WCL1 and the second wavelength conversion layer WCL2, between the second wavelength conversion layer WCL2 and the optically transparent layer TL, and between the optically transparent layer TL and the first wavelength conversion layer WCL1.

Figure 9B:
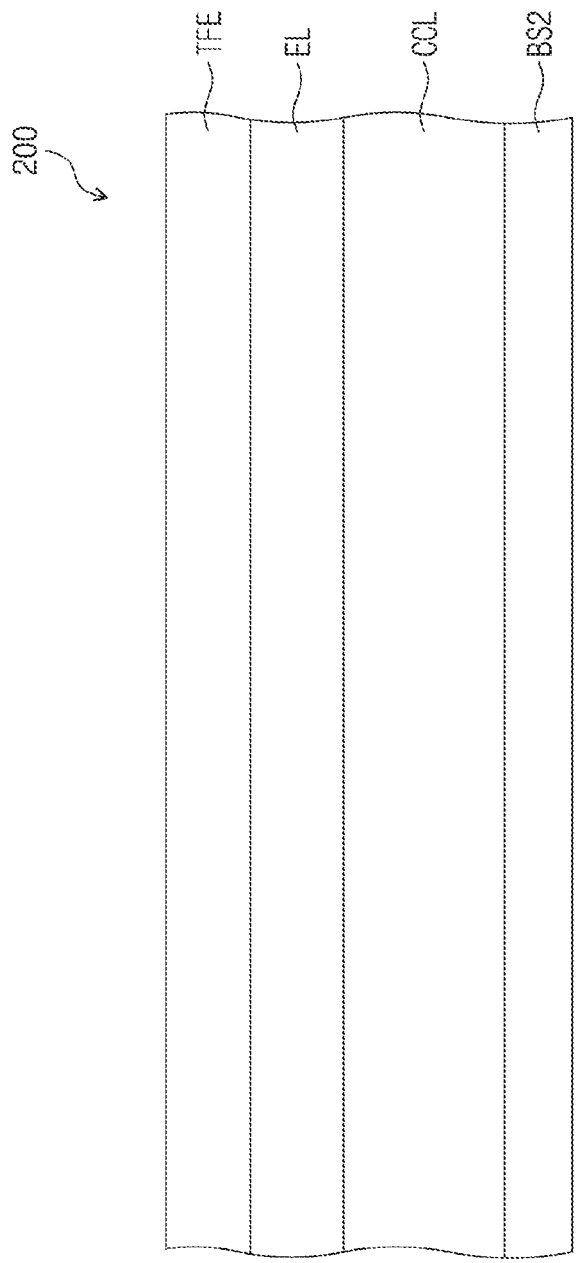

Referring to FIG. 9B, the second substrate 200 may be formed. The formation of the second substrate 200 may include forming the base layer BS2, forming the circuit layer CCL on the base layer BS2, forming the emission layer EL on the circuit layer CCL, and forming the thin film encapsulation layer TFE on the emission layer EL. The circuit layer CCL, the emission layer EL, and the thin film encapsulation layer TFE are schematically illustrated in FIG. 9B.

Figure 9C:
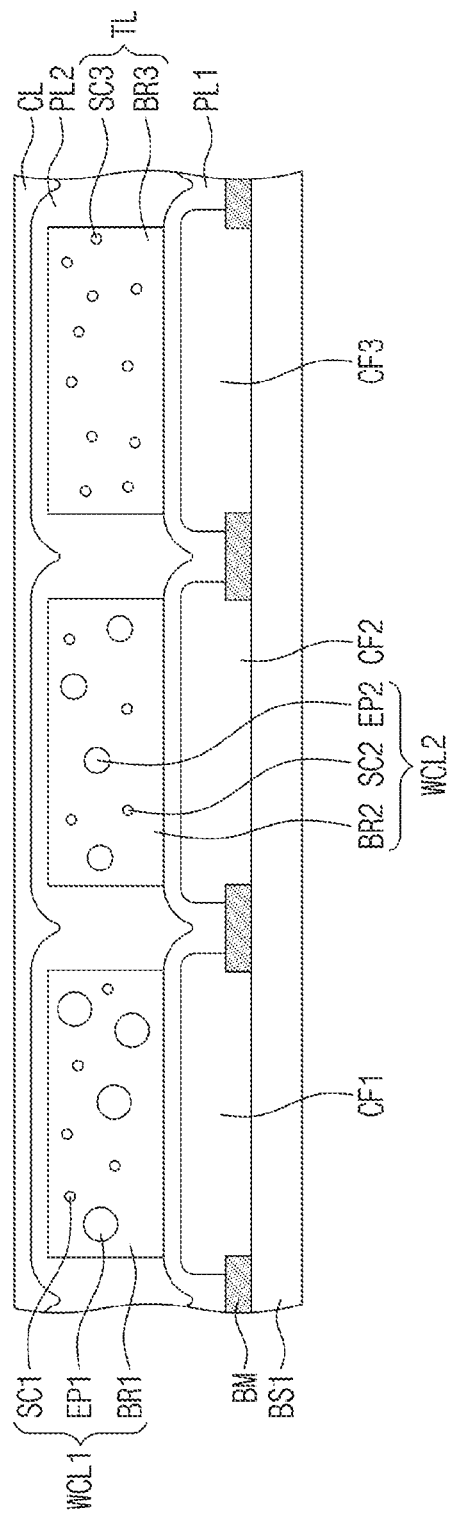

Referring to FIGS. 3 and 9C, the second layer CL may be formed on the first substrate 100. A material of the second layer CL may be determined based on the thickness DTa of the first layer FL and the first refractive index $n_1$ of the first layer FL.

The second layer CL may be selected from materials satisfying a condition for the second refractive index $n_2$ given by the following formula:

$$0 < n_2 < n_1 \times \sin\left(\tan^{-1}\left(\frac{DT2}{DTa}\right)\right) \quad \text{[Formula 5]}$$

Referring to FIG. 9D, the first layer FL may be formed between the second layer CL and the second substrate 200. The second layer CL may be a gap-filling material. The second layer CL may include a resin (e.g., silicone-based polymer, epoxy-based resin or acrylic-based resin).

Figure 10:
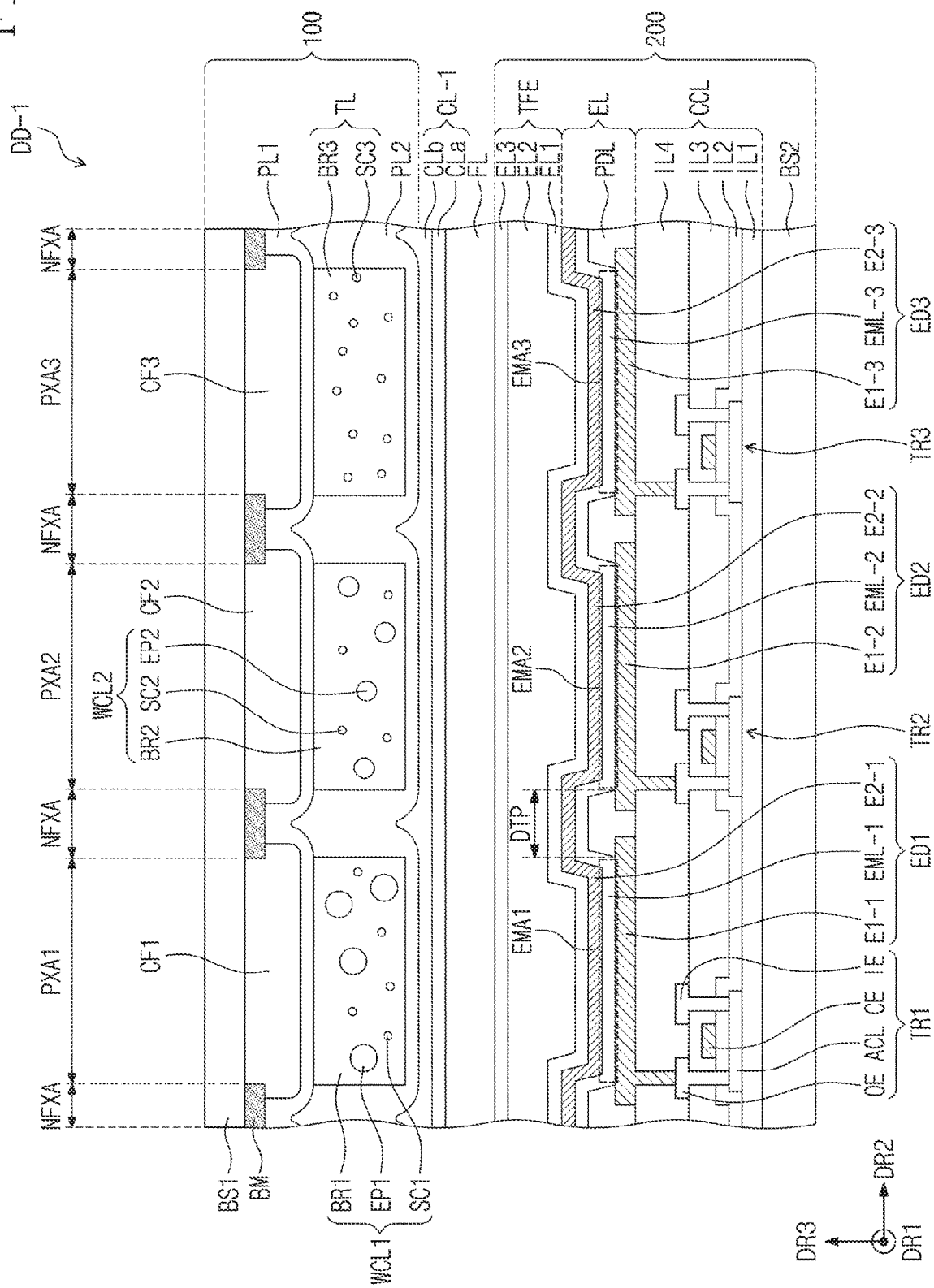
FIG. 10 is an enlarged cross-sectional view illustrating a portion of a display device according to an exemplary embodiment of the inventive concept.

FIG. 10 is an enlarged cross-sectional view illustrating a portion of a display device according to an exemplary embodiment of the inventive concept. For convenience of explanation, elements previously described with reference to FIG. 3 may be identified by the same reference numerals, and a further description of elements and technical aspects previously described may be omitted.

Referring to FIG. 10, a display device DD-1 may include the first substrate 100, the second substrate 200, a second layer CL-1, and the first layer FL.

The second layer CL-1 may include one or more layers. For example, the second layer CL-1 may include a first control layer CLa and a second control layer CLb. The first control layer CLa may be disposed on the first layer FL, and the second control layer CLb may be disposed on the first control layer CLa.

FIG. 10 illustrates an example in which the second layer CL-1 includes two control layers. However, the inventive concept is not limited to this example. For example, the second layer CL-1 may include three or more control layers.

The first control layer CLa and the second control layer CLb may include the same material or may include materials different from each other. Refractive indices of the first control layer CLa and the second control layer CLb may be substantially the same or may be different from each other.

Among light incident into a region between the first control layer CLa and the first layer FL, an incident angle of a light causing the color-mixing issue may be defined as a color-mixing incident angle. A refractive index of the first control layer CLa may be selected such that a total reflection critical angle between the first control layer CLa and the first layer FL is within a range less than the color-mixing incident angle.

The second control layer CLb may include a material whose refractive index is higher than that of the first control layer CLa. Thus, the second control layer CLb may change a propagation direction of light, and this may be used to more effectively prevent the color-mixing issue from occurring or reducing the degree of the color-mixing issue.

According to an exemplary embodiment of the inventive concept, a display device may include a first layer having a first refractive index and a second layer having a second refractive index lower than the first refractive index. Light incident at an angle causing the color-mixing issue described herein may be totally reflected at an interface between the first layer and the second layer. Thus, the color-mixing issue may be prevented from occurring between adjacent pixels (or reduced), and an image quality of the display device may be improved.

While the inventive concept has been particularly shown and described with reference to the exemplary embodiments thereof, it will be understood by one of ordinary skill in the art that various changes in form and detail may be made therein without departing from the spirit and scope of the inventive concept as defined by the following claims.

What is claimed is:

1. A display device, comprising:
a first substrate, in which a first pixel region and a second pixel region are defined;
a second substrate comprising a first display element and a second display element, wherein the first display element is disposed at a location corresponding to the first pixel region and the second display element is disposed at a location corresponding to the second pixel region;

a first layer disposed between the first substrate and the second substrate, the first layer having a first refractive index; and a second layer disposed between the first substrate and the first layer, the second layer having a second refractive index lower than the first refractive index, wherein the first substrate comprises:

a base layer;

a first wavelength conversion layer disposed below the base layer and in the first pixel region; and a second wavelength conversion layer disposed below the base layer and in the second pixel region, wherein the second wavelength conversion layer is spaced apart from the first wavelength conversion layer, wherein a total reflection critical angle between the first layer and the second layer is smaller than an incident angle of light which is emitted from the first display element and is incident into the second wavelength conversion layer.

2. The display device of claim 1, wherein the first substrate further comprises a third pixel region defined therein, the second substrate further comprises a third display element disposed at a location corresponding to the third pixel region, and the first substrate further comprises an optically transparent layer disposed below the base layer and in the third pixel region.

3. The display device of claim 2, wherein the total reflection critical angle is smaller than a minimum incident angle of light, which is emitted from one of the first display element, the second display element, and the third display element, and the light is incident into one of the first wavelength conversion layer, the second wavelength conversion layer, and the optically transparent layer, which does not correspond to the one of the first display element, the second display element, and the third display element.

4. The display device of claim 2, wherein the first substrate further comprises a protection layer covering the first wavelength conversion layer, the second wavelength conversion layer, and the optically transparent layer, and the protection layer is disposed between the second layer and the first wavelength conversion layer, the second wavelength conversion layer, and the optically transparent layer.

5. The display device of claim 2, wherein each of the first display element, the second display element, and the third display element comprises a first electrode, a second electrode, and an emission layer disposed between the first electrode and the second electrode and provides a source light, wherein the emission layers of the first display element, the second display element, and the third display element are connected to each other.

6. The display device of claim 5, wherein the incident angle of light is $$\tan^{-1}\left(\frac{DT2}{DT1}\right),$$

wherein DT1 is a distance between the emission layer and the second wavelength conversion layer, and DT2 is a distance between the first wavelength conversion layer and the second wavelength conversion layer.

7. The display device of claim 5, wherein the optically transparent layer comprises a base resin and scattering objects dispersed in the base resin, the first wavelength conversion layer comprises a first light emitter that converts a wavelength of the source light, and the second wavelength conversion layer comprises a second light emitter that converts the wavelength of the source light and is different from the first light emitter.

8. The display device of claim 5, wherein the source light is blue light.

9. The display device of claim 5, wherein the emission layer comprises at least two sub-emission layers.

10. The display device of claim 2, wherein the first substrate further comprises:

a first color filter layer disposed between the base layer and the first wavelength conversion layer;

a second color filter layer disposed between the base layer and the second wavelength conversion layer; and a third color filter layer disposed between the base layer and the optically transparent layer.

11. The display device of claim 10, wherein the first color filter layer is a red color filter layer, the second color filter layer is a green color filter layer, and the third color filter layer is a blue color filter layer.

12. A display device, comprising:

a bottom plate comprising a plurality of light-emitting regions;

a top plate comprising a base layer and a plurality of optical layers disposed below the base layer, wherein the plurality of optical layers corresponds to the light-emitting regions in a one-to-one manner;

a first layer disposed between the bottom plate and the top plate, the first layer having a first refractive index; and a second layer disposed between the first layer and the top plate, the second layer having a second refractive index lower than the first refractive index, wherein the first refractive index and the second refractive index satisfy $$\sin^{-1}\left(\frac{n_2}{n_1}\right) < \tan^{-1}\left(\frac{DT2}{DT1}\right),$$

wherein $n_1$ is the first refractive index, $n_2$ is the second refractive index, DT1 is a distance between one of the light-emitting regions and one of the plurality of the optical layers disposed on the one of the light-emitting regions, and DT2 is a distance corresponding to a space separating two adjacent layers of the plurality of optical layers.

13. The display device of claim 12, wherein the light-emitting regions provide a blue light, and the plurality of optical layers comprises a first wavelength conversion layer that converts the blue light to a red light, a second wavelength conversion layer that converts the blue light to a green light, and an optically transparent layer that transmits the blue light.

14. The display device of claim 13, wherein DT2 is a minimum distance of a first distance between the first wavelength conversion layer and the second wavelength conversion layer, a second distance between the second wavelength conversion layer and the optically transparent layer, and a third distance between the first wavelength conversion layer and the optically transparent layer.

15. The display device of claim 13, wherein the top plate further comprises:
- a red color filter layer disposed between the base layer and the first wavelength conversion layer;
- a green color filter layer disposed between the base layer and the second wavelength conversion layer; and
- a blue color filter layer disposed between the base layer and the optically transparent layer.

16. The display device of claim 12, wherein the top plate further comprises a protection layer covering the plurality of optical layers, and
the protection layer is disposed between the second layer and the plurality of optical layers.

17. A method of fabricating a display device, comprising:
- forming a first substrate comprising a first wavelength conversion layer and a second wavelength conversion layer;
- forming a second substrate comprising a first display element and a second display element, wherein the first display element is formed at a location corresponding to the first wavelength conversion layer and the second display element is formed at a location corresponding to the second wavelength conversion layer;
- determining a first refractive index of a high refraction layer to be disposed between the first substrate and the second substrate;
- determining a thickness of the high refraction layer;
- determining a second refractive index of a low refraction layer to be disposed between the high refraction layer and the first substrate based on the thickness of the high refraction layer and the first refractive index;
- forming the low refraction layer on the first substrate; and
- forming the high refraction layer between the low refraction layer and the second substrate.

18. The method of claim 17, wherein the second refractive index is within a range given by $$0 < n_2 < n_1 \times \sin\left(\tan^{-1}\left(\frac{DT2}{DTa}\right)\right),$$

wherein $n_1$ is the first refractive index, $n_2$ is the second refractive index, DTa is the thickness of the high refraction layer, and DT2 is a distance between the first wavelength conversion layer and the second wavelength conversion layer.

19. The method of claim 17, wherein a total reflection critical angle between the high refraction layer and the low refraction layer is less than an incident angle of light that is emitted from the first display element and is incident into the second wavelength conversion layer.

20. The method of claim 17, wherein forming the first substrate comprises:
- forming a base layer;
- forming a plurality of color filter layers on a surface of the base layer;
- forming the first wavelength conversion layer, the second wavelength conversion layer, and an optically transparent layer on the plurality of color filter layers; and
- forming a protection layer on the first wavelength conversion layer, the second wavelength conversion layer, and the optically transparent layer,
wherein the low refraction layer is formed on the protection layer.

* * * * *